(12) United States Patent
Liu (10) Patent No.: US 10,902,816 B2
(45) Date of Patent: Jan. 26, 2021

(54) INTEGRATED CIRCUIT FOR DRIVING DISPLAY PANEL AND FAN-OUT COMPENSATION METHOD THEREOF

(71) Applicant: Novatek Microelectronics Corp., Hsinchu (TW)

(72) Inventor: Yu-Shao Liu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 195 days.

(21) Appl. No.: 15/787,710

(22) Filed: Oct. 19, 2017

(65) Prior Publication Data
US 2018/0293955 A1  Oct. 11, 2018

Related U.S. Application Data

(60) Provisional application No. 62/483,465, filed on Apr. 10, 2017.

(51) Int. Cl.
*G09G 3/36* (2006.01)
*G09G 3/20* (2006.01)
(Continued)

(52) U.S. Cl.
CPC .......... *G09G 3/3696* (2013.01); *G09G 3/20* (2013.01); *G09G 5/003* (2013.01);
(Continued)

(58) Field of Classification Search
CPC ........ G09G 5/003; G09G 3/3696; G09G 3/20; G09G 2330/026; G09G 2330/028;
(Continued)

(56) References Cited

U.S. PATENT DOCUMENTS 8,217,866 B2     7/2012  Ryu et al.
2003/0098833 A1*  5/2003  Sekido ................ G09G 3/3688
                                                              345/87

(Continued)

FOREIGN PATENT DOCUMENTS

CN     1909046    2/2007
CN     101162568  4/2008
(Continued)

OTHER PUBLICATIONS

"Office Action of China Counterpart Application", dated Nov. 4, 2020, p. 1-p. 10.

*Primary Examiner* — David Tung
(74) *Attorney, Agent, or Firm* — JCIPRNET (57) ABSTRACT

A driving integrated circuit (IC) and a fan-out compensation method thereof are provided. The driving IC includes a plurality of driving channel circuits, a plurality of output buffer circuits and a compensation control circuit. The input terminals of the output buffer circuits are coupled to the output terminals of the driving channel circuits in a one-to-one manner. The output terminals of the output buffer circuits are coupled a plurality of data lines of a display panel in a one-to-one manner. The compensation control circuit is coupled to the output buffer circuits for adjusting the slew rate of the output terminals of the output buffer circuits to compensate difference in delay times between the data lines of the display panel.

12 Claims, 11 Drawing Sheets

(51) Int. Cl.
  *G09G 5/00* (2006.01)
  *H03K 19/0175* (2006.01)
(52) U.S. Cl.
  CPC . *H03K 19/0175* (2013.01); *G09G 2310/0275* (2013.01); *G09G 2310/0291* (2013.01); *G09G 2310/061* (2013.01); *G09G 2310/066* (2013.01); *G09G 2310/08* (2013.01); *G09G 2320/0223* (2013.01); *G09G 2330/025* (2013.01); *G09G 2330/026* (2013.01); *G09G 2330/028* (2013.01)
(58) Field of Classification Search
  CPC ......... G09G 2330/025; G09G 2330/08; G09G 2330/0275; G09G 2330/0291; G09G 2330/066; G09G 2330/061; G09G 2320/0223; H03K 19/0175
  See application file for complete search history.

(56) References Cited

U.S. PATENT DOCUMENTS

| | | | | |
|---|---|---|---|---|
| 2004/0036670 | A1* | 2/2004 | Chung | G09G 3/3688 345/99 |
| 2004/0179027 | A1* | 9/2004 | Nakai | G09G 3/3614 345/690 |
| 2007/0024540 | A1 | 2/2007 | Ryu et al. | |
| 2007/0115271 | A1* | 5/2007 | Seo | G09G 3/3688 345/204 |
| 2008/0278473 | A1* | 11/2008 | An | H03K 19/00361 345/214 |
| 2009/0058788 | A1* | 3/2009 | Ha | G09G 3/3611 345/99 |
| 2009/0167745 | A1* | 7/2009 | Enjou | G09G 3/20 345/211 |
| 2010/0194731 | A1* | 8/2010 | Hiratsuka | G09G 3/3688 345/211 |
| 2011/0057922 | A1* | 3/2011 | Yasuda | H03F 3/45183 345/212 |
| 2013/0141403 | A1* | 6/2013 | Shibuya | H03K 5/15 345/204 |
| 2014/0253534 | A1* | 9/2014 | Kim | G09G 3/3685 345/213 |
| 2015/0035813 | A1* | 2/2015 | Lei | G09G 3/3208 345/205 |
| 2016/0093270 | A1* | 3/2016 | Lee | G09G 3/3688 345/690 |
| 2016/0104415 | A1* | 4/2016 | Yeo | G09G 3/3685 345/212 |

FOREIGN PATENT DOCUMENTS

| | | |
|---|---|---|
| CN | 102969990 | 3/2013 |
| CN | 103546140 | 1/2014 |

* cited by examiner

INTEGRATED CIRCUIT FOR DRIVING DISPLAY PANEL AND FAN-OUT COMPENSATION METHOD THEREOF

CROSS-REFERENCE TO RELATED APPLICATION

This application claims the priority benefit of U.S. provisional application Ser. No. 62/483,465, filed on Apr. 10, 2017. The entirety of the above-mentioned patent application is hereby incorporated by reference herein and made a part of this specification.

BACKGROUND

Field of the Invention

The invention relates to a display circuit and more particularly, to a driving integrated circuit (IC) of a display panel and a fan-out compensation method thereof.

Description of Related Art

Figure 1:
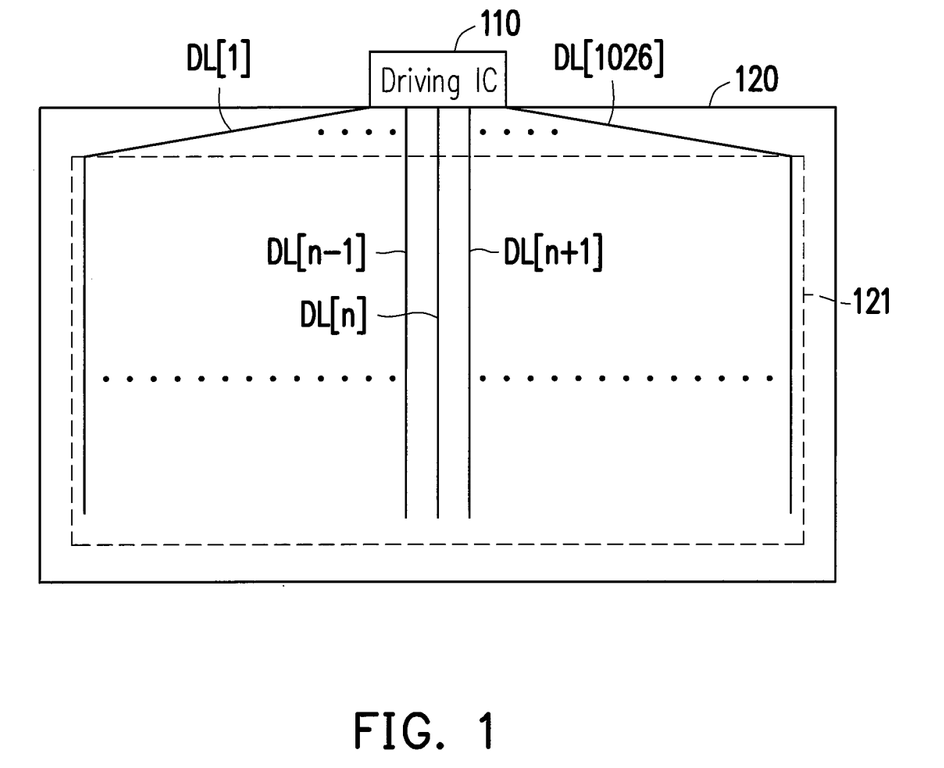
FIG. 1 is a schematic layout diagram illustrating a display panel.

FIG. 1 is a schematic layout diagram illustrating a display panel 120. The display panel 120 illustrated in FIG. 1 includes a display region 121 and another region (e.g., a frame region). The display panel 120 is disposed with a plurality of data lines (or referred to as source lines), for example, a data line DL[1], . . . , a data line DL[n−1], a data line DL[n], a data line DL[n+1], . . . and a data line DL[1026] illustrated in FIG. 1. A plurality of driving channel circuits of a driving IC 110 are respectively coupled to the data lines DL[1] to DL[1026] of the display panel 120 in a one-to-one manner. The driving IC 110 may transmit a plurality of pixel voltages to pixel unit circuits (not shown) of the display region 121 through the data lines DL[1] to DL[1026].

Based on relation of locations, different data lines DL[1] to DL[1026] usually have different lengths. Differences in the lengths among the data lines result in differences in impedances. As illustrated in FIG. 1, fan-out wires (i.e., the data lines) at two terminals of the driving IC 110 are longer and thus, have greater resistances, while fan-out wires (i.e., the data lines) in the center of the driving IC 110 are shorter and thus, have lower resistances. Along with the increase of a size of the display panel 120, the differences in the lengths among the data lines become larger. The differences in the resistances among the data lines may cause resistance-capacitance (RC) time constants of panel loading to be different, which may result in inconsistency in charging/discharging speeds. Namely, the differences in the resistances among the data lines may influence delay times of transmitting the pixel voltages to the pixel unit circuits. As a resolution of the display panel 120 increases, a duration of charging the driving IC 110 decreases, and the differences in resistances among different data lines becomes more and more intolerable. The fan-out resistors between the driving IC 110 and the display panel 120 may result in inconsistency in charging the pixels within the panel, which leads to poor display uniformity of the panel. Therefore, when the differences in the resistances among different data lines, i.e., the differences in the delay times among the data lines DL[1] to DL[1026], are too large, it usually results in poor display quality of images.

SUMMARY

The invention provides a driving integrated circuit (IC) and a fan-out compensation method thereof for compensating differences in delay times caused by differences in resistances among data lines.

According to an embodiment of the invention, a driving integrated circuit (IC) configured to drive a display panel is provided. The driving IC includes a plurality of driving channel circuits, a plurality of output buffer circuits and a compensation control circuit. Input terminals of the output buffer circuits are coupled to output terminals of the driving channel circuits in a one-to-one manner. Output terminals of the output buffer circuits are configured to be coupled to data lines of the display panel in a one-to-one manner. The compensation control circuit is coupled to the output buffer circuits for adjusting slew rates of the output terminals of the output buffer circuits to compensate differences in delay times between the data lines of the display panel.

According to an embodiment of the invention, a driving integrated circuit (IC) configured to drive a display panel is provided. The driving IC includes a plurality of driving channel circuits, a plurality of output buffer circuits, a voltage dividing circuit and a plurality of bias circuits. Input terminals of the output buffer circuits are coupled to output terminals of the driving channel circuits in one-to-one manner. Output terminals of the output buffer circuits are configured to be coupled to a plurality of data lines of the display panel in one-to-one manner. Each of the output buffer circuits has a bias terminal. The voltage dividing circuit includes a plurality of coupling elements. Each of the coupling elements is coupled between two voltage dividing nodes of a plurality of voltage dividing nodes. The voltage dividing nodes are coupled to the bias terminals of the output buffer circuits respectively. The bias circuits includes a first bias circuit for biasing a first voltage dividing node of the voltage dividing nodes to have a first bias voltage and a second bias circuit for biasing a last voltage dividing node of the voltage dividing nodes to have a second bias voltage.

According to an embodiment of the invention, a fan-out compensation method of a driving IC is provided. The driving IC is configured to drive a display panel. The driving IC includes a plurality of driving channel circuits, a plurality of output buffer circuits and a compensation control circuit. Input terminals of the output buffer circuits are coupled to output terminals of the driving channel circuits in a one-to-one manner. Output terminals of the output buffer circuits are configured to be coupled to a plurality of data lines of the display panel in a one-to-one manner. The fan-out compensation method includes: adjusting slew rates of the output terminals of the output buffer circuits by the compensation control circuit, so as to compensate differences in delay times between the data lines of the display panel.

Based on the above, in some embodiments of the invention, the driving IC and the fan-out compensation method thereof use the compensation control circuit. The compensation control circuit can adjust the slew rates of the output terminals of the output buffer circuits for compensating the differences in the delay times between the data lines of the display panel caused by differences in resistances between the data lines of the display panel.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, components/members/steps using the same referral numerals in the drawings and description refer to the same or like parts. Components/members/steps using the same referral numerals or using the same terms in different embodiments may cross-refer related descriptions. In some embodiments, by adjusting the slew rates of channel operational amplifiers (OPs) or output buffer circuits for driving different data lines or data channels, the OPs or the output buffer circuits can tend to discharge/charge the panel with a consistent speed. In other words, by controlling the slew rates of the output buffer circuits, differences caused by different values of fan-out resistors can be compensated. In some embodiments, by utilizing a resistor divider, different bias voltages can be generated, which allows different values of slew rates to be achieved and hence compensates differences caused by different values of fan-out resistors.

Figure 2:
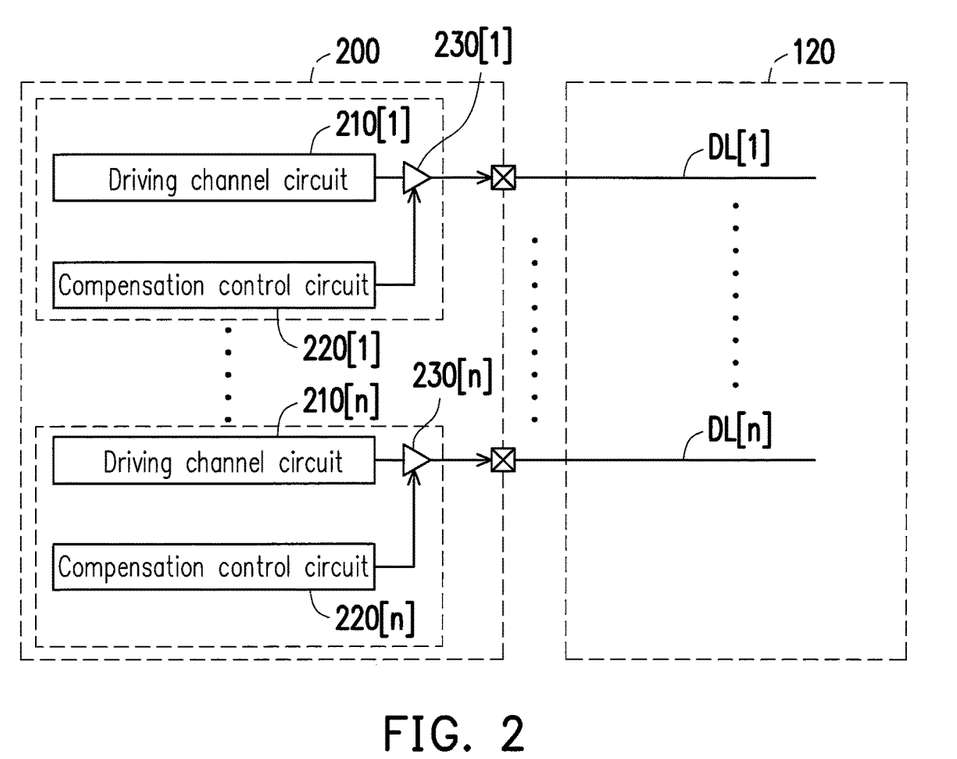
FIG. 2 is a schematic circuit block diagram illustrating a driving integrated circuit (IC) according to an embodiment.

FIG. 2 is a schematic circuit block diagram illustrating a driving integrated circuit (IC) 200 according to an embodiment. The driving IC 200 is configured to drive a plurality of data lines of a display panel 120, for example, data lines DL[1] to DL[n] illustrated in FIG. 2. The driving IC 200 includes a plurality of driving channel circuits, a plurality of output buffer circuits and a plurality of compensation control circuit. For instance, the driving IC 200 includes n driving channel circuits 210[1] to 210[n], n compensation control circuits 220[1] to 220[n] and n output buffer circuits 230[1] to 230[n], where n is an integer and may be determined based on a design requirement. Based on a design requirement, each of the output buffer circuits 230[1] to 230[n] may include an operational amplifier (OP). Input terminals of the output buffer circuits 230[1] to 230[n] can be coupled to output terminals of the driving channel circuits 210[1] to 210[n] in a one-to-one manner. Output terminals of the output buffer circuits 230[1] to 230[n] can be coupled to the data lines DL[1] to DL[n] of the display panel 120 through pads. In a normal operation period, the driving channel circuits 210[1] to 210[n] may output corresponding pixel voltages through the output buffer circuits 230[1] to 230[n] to drive the data lines DL[1] to DL[n] and pixel unit circuits (not shown). Each of the driving channel circuits 210[1] to 210[n] includes various elements, such as a latch, a digital-to-analog converter (DAC) and so on.

The compensation control circuits 220[1] to 220[n] may control slew rates of the output buffer circuits 230[1] to 230[n], thereby compensating differences caused by fan-out resistors (i.e., differences in resistances between the data lines DL[1] to DL[n]), such that speeds of the output buffer circuits 230[1] to 230[n] charging/discharging the display panel 120 may tend to be consistent. In other words, the data lines with high fan-out resistances (i.e., great delay times) may be equipped with the output buffer circuits having fast slew rates, and the data lines with low fan-out resistances (i.e., small delay times) may be equipped with the output buffer circuits having slow slew rates. To implement a plurality of output buffer circuits having different slew rates, the driving IC 200 may be equipped with a plurality of compensation control circuits. Accordingly, due to the increase of the number of the compensation control circuits 220[1] to 220[n], a great number of circuits and traces are required for accomplishing the embodiment illustrated in FIG. 2.

Generally speaking, a slew rate SR of each of the output buffer circuits 230[1] to 230[n] may be determined by a differential pair current (i.e., tail current) $I_{TAIL}$ and a Miller compensation capacitance Cc, as expressed by Formula (1). Thus, when each slew rate SR requires to be adjusted, the adjustment may be achieved by adjusting the parameter $I_{TAIL}$ and the parameter Cc. If the tail currents $I_{TAIL}$ are selected for adjusting the slew rates SR, a plurality of corresponding compensation control circuits are required to be disposed in one driving IC 200 (as illustrated in FIG. 2). For example, if 20 types of output slew rates are needed by the same driving IC 200, then 20 sets of compensation control circuits are required to be disposed in the driving IC 200. In the embodiment below, a plurality of output slew rates may be implemented by changing the tail currents $I_{TAIL}$ or the Miller compensation capacitances Cc.

$$SR = \frac{I_{TAIL}}{Cc} \qquad \text{Formula (1)}$$

Figure 3:
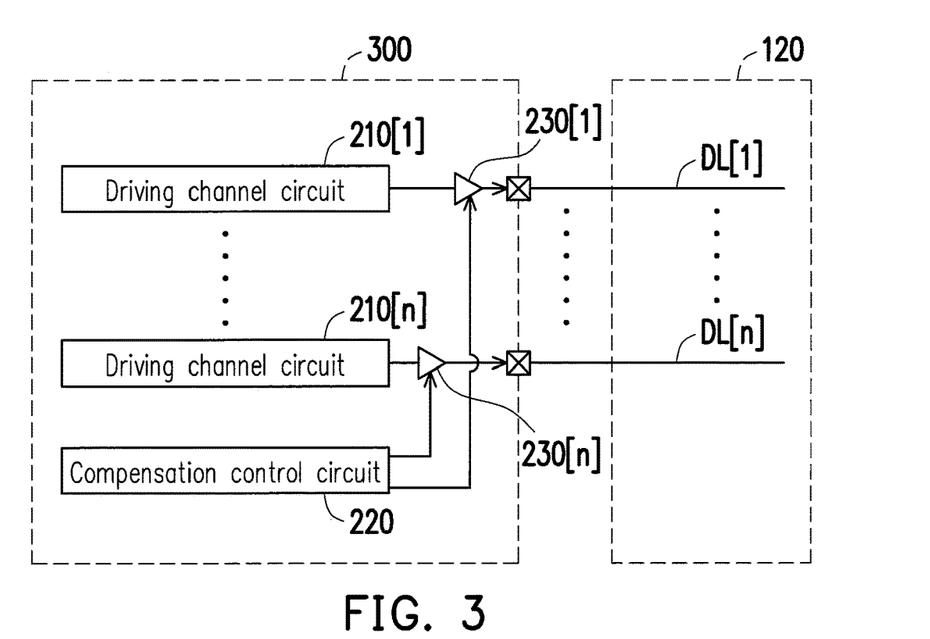
FIG. 3 is a schematic circuit block diagram illustrating a driving IC according to an embodiment of the invention.

FIG. 3 is a schematic circuit block diagram illustrating a driving IC 300 according to an embodiment of the invention. The driving IC 300 is configured to drive a plurality of data lines of a display panel 120, for example, data lines DL[1]

to DL[n] illustrated in FIG. 3. The driving IC 300 includes a plurality of driving channel circuits, a plurality of output buffer circuits and a compensation control circuit. For instance, the driving IC 300 includes n driving channel circuits 210[1] to 210[n], a compensation control circuit 220 and n output buffer circuits 230[1] to 230[n], where n is an integer and may be determined based on a design requirement. The display panel 120 and the data lines DL[1] to DL[n] illustrated in FIG. 3 may refer to descriptions related to the embodiment illustrated in FIG. 1, the driving channel circuits 210[1] to 210[n] and the output buffer circuits 230[1] to 230[n] illustrated in FIG. 3 may refer to descriptions related to the embodiment illustrated in FIG. 2 and thus, will not be repeated.

In the embodiment illustrated in FIG. 3, the compensation control circuit 220 is coupled to the output buffer circuits 230[1] to 230[n]. The compensation control circuit 220 may adjust slew rates of output terminals of the output buffer circuits 230[1] to 230[n], such that the slew rates of the output buffer circuits 230[1] to 230[n] are adapted to delay times of the data lines DL[1] to DL[n] of the display panel 120. Thereby, the compensation control circuit 220 may control the slew rates of the output terminals of the output buffer circuits 230[1] to 230[n] to compensate differences in the delay times between the data lines DL[1] to DL[n] of the display panel 120. In some embodiments, the compensation control circuit 220 may change tail currents of the output buffer circuits 230[1] to 230[n] or Miller capacitances of the output buffer circuits 230[1] to 230[n], so as to adjust the slew rates of the output terminals of the output buffer circuits 230[1] to 230[n]. The tail currents and the Miller capacitances are conventional, and thus, implementation details related to "the changes of the tail currents or the Miller capacitances of the output buffer circuits" will no longer repeatedly described.

Figure 4:
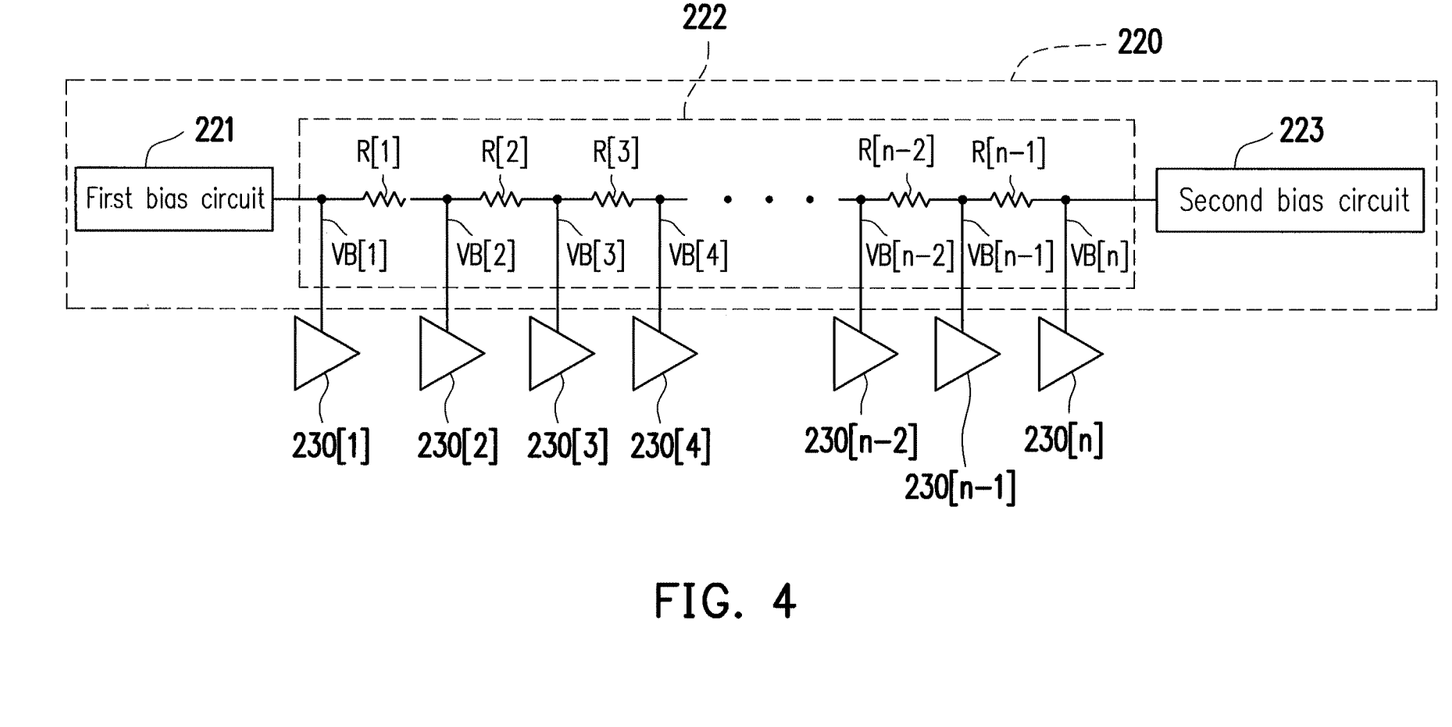
FIG. 4 is a schematic circuit block diagram illustrating the compensation control circuit depicted in FIG. 3 according to an embodiment of the invention.

FIG. 4 is a schematic circuit block diagram illustrating the compensation control circuit 220 depicted in FIG. 3 according to an embodiment of the invention. In the embodiment illustrated in FIG. 4, the compensation control circuit 220 includes a first bias circuit 221, a voltage dividing circuit 222 and a second bias circuit 223. The first bias circuit 221 may provide at least one first bias voltage (or at least one first bias current). Similarly, the second bias circuit 223 may provide at least one second bias voltage (or at least one second bias current). A first terminal of the voltage dividing circuit 222 is coupled to first bias circuit 221 to receive the first bias voltage (or the first bias current). A second terminal of the voltage dividing circuit 222 is coupled to second bias circuit 223 to receive the second bias voltage (or the second bias current).

In the embodiment illustrated in FIG. 4, each of the output buffer circuits 230[1] to 230[n] has a bias terminal. The bias terminal may be any bias terminal controlling a bias current of the output buffer circuit or an operational amplifier therein. For example, the bias terminal can be a power supply terminal of the operational amplifier. The bias terminal can be any terminal affecting the slew rate of the output buffer circuit. The voltage dividing circuit 222 includes a plurality of coupling elements (preferably but not limited to resistive elements), and each of the coupling elements is coupled between two voltage dividing nodes of a plurality of voltage dividing nodes. The first bias circuit 221 and the second bias circuit 223 are configured to induce a current to flow from a first voltage dividing node of the voltage dividing nodes to a last voltage dividing node of the voltage dividing nodes through the coupling elements (e.g., the resistive elements) and the other voltage dividing nodes. Bias voltages can therefore be distributed from the first voltage dividing node to the last voltage dividing node through the coupling elements (e.g., the resistive elements) and the other voltage dividing nodes. The voltage dividing nodes are respectively coupled to bias terminals of the output buffer circuits 230[1] to 230[n], as illustrated in FIG. 4.

In some embodiments, the bias voltages VB[1] to VB[n] are distributed from the first voltage dividing node to the last voltage dividing node increasingly. In some other embodiments, the bias voltages VB[1] to VB[n] are distributed from the first voltage dividing node to the last voltage dividing node decreasingly.

Figure 5:
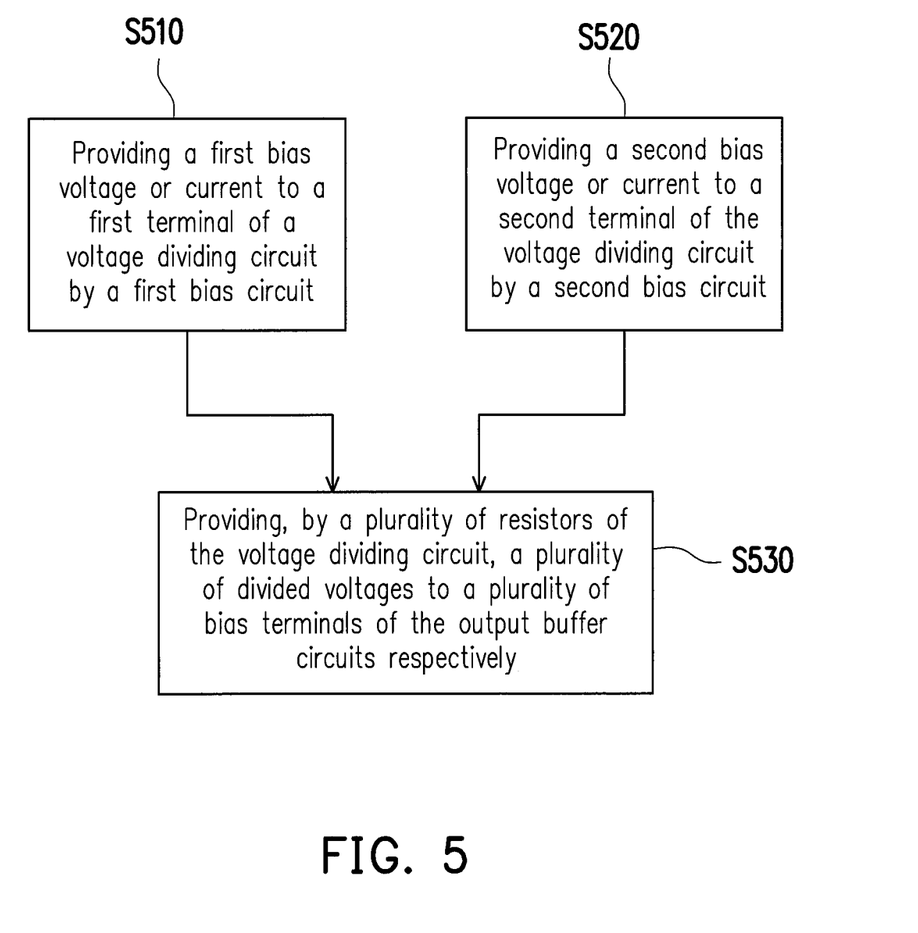
FIG. 5 is a flowchart illustrating a fan-out compensation method of a driving IC according to an embodiment of the invention.

FIG. 5 is a flowchart illustrating a fan-out compensation method of a driving IC according to an embodiment of the invention. Refer to FIG. 4 and FIG. 5. In step S510, the first bias circuit 221 may provide at least one first bias voltage (or at least one first bias current) to the first terminal of the voltage dividing circuit 222. In step S520, the second bias circuit 223 may provide at least one second bias voltage (or at least one second bias current) to the second terminal of the voltage dividing circuit 222.

In step S530, a plurality of resistors (e.g., R[1], R[2], R[3], R[n−2] and R[n−1] illustrated in FIG. 4) coupled between a plurality of voltage dividing nodes of the voltage dividing circuit 222 provide a plurality of divided voltages (e.g., VB[1], VB[2], VB[3], VB[4], . . . , VB[n−2], VB[n−1] and VB[n] illustrated in FIG. 4). The bias voltages VB[1] to VB[n] are respectively provided to the bias terminals of the output buffer circuits (e.g., 230[1], 230[2], 230[3], 230[4], . . . , 230[n−2], 230[n−1] and 230[n] illustrated in FIG. 4) to determine the tail currents of the output buffer circuits 230[1] to 230[n]. Because the bias voltages VB[1] to VB[n] are different from one another, the tail currents of the output buffer circuits 230[1] to 230[n] are also different, such that the slew rates of the output terminals of the output buffer circuits 230[1] to 230[n] are different from one another. Based on a setting of the first bias voltage (or the first bias current) output by the first bias circuit 221 and/or a setting of the second bias voltage (or the second bias current) output by the second bias circuit 223, the compensation control circuit 220 may adjust the slew rates of the output terminals of the output buffer circuits 230[1] to 230[n], such that the slew rates of the output buffer circuits 230[1] to 230[n] are adapted to the delay times of the data lines DL[1] to DL[n] of the display panel 120.

Figure 6:
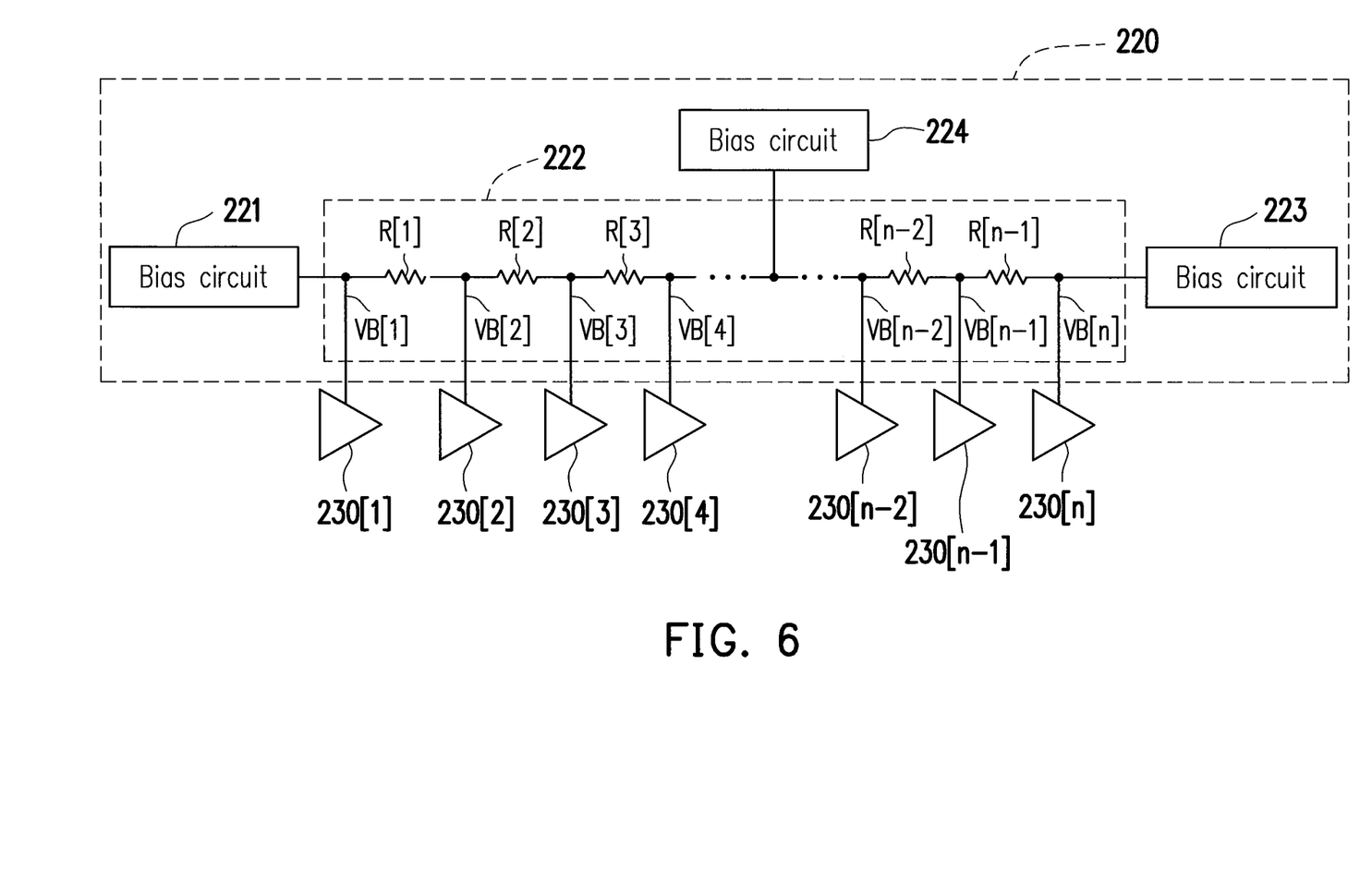
FIG. 6 is a schematic circuit block diagram illustrating the compensation control circuit depicted in FIG. 3 according to another embodiment of the invention.

FIG. 6 is a schematic circuit block diagram illustrating the compensation control circuit 220 depicted in FIG. 3 according to another embodiment of the invention. The output buffer circuits 230[1] to 230[n], the first bias circuit 221, the voltage dividing circuit 222 and the second bias circuit 223 illustrated in FIG. 6 may be derived with reference to the descriptions related to the embodiments illustrated in FIG. 4 and FIG. 5 and thus, will not be repeated. In the embodiment illustrated in FIG. 6, the compensation control circuit 220 further includes a third bias circuit 224. The third bias circuit 224 may generate at least one third bias voltage (or at least one third bias current) to one of the voltage dividing nodes of the voltage dividing circuit 222. Based on the setting of the first bias voltage (or the first bias current) output by the first bias circuit 221, the setting of the second bias voltage (or the second bias current) output by the second bias circuit 223 and/or a setting of the third bias voltage (or the third bias current) output by the third bias circuit 224, the compensation control circuit 220 may adjust the slew rates of the output terminals of the output buffer circuits 230[1] to 230[n], such that the slew rates of the output buffer circuits 230[1] to 230[n] are adapted to the delay times of the data lines DL[1] to DL[n] of the display panel 120.

Figure 7:
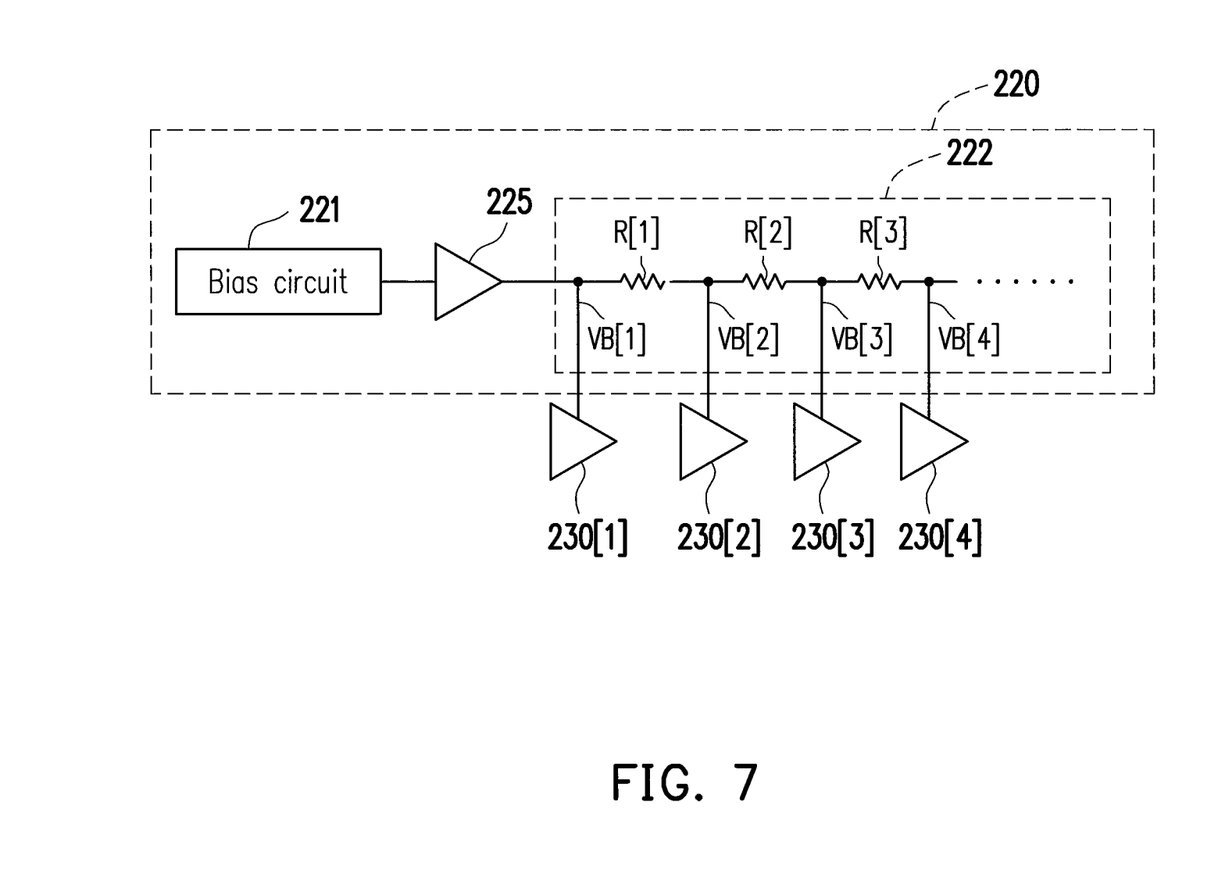
FIG. 7 is a schematic circuit block diagram illustrating the compensation control circuit depicted in FIG. 3 according to yet another embodiment of the invention.

FIG. 7 is a schematic circuit block diagram illustrating the compensation control circuit 220 depicted in FIG. 3 according to yet another embodiment of the invention. The compensation control circuit 220, the first bias circuit 221 and the voltage dividing circuit 222 illustrated in FIG. 7 may be derived with reference to the descriptions related to the embodiments illustrated in FIG. 4, FIG. 5 and/or FIG. 6 and thus, will not be repeated. In the embodiment illustrated in FIG. 7, the compensation control circuit 220 of the driving IC 300 further includes a buffer 225. An input terminal of the buffer 225 is coupled to an output terminal of the first bias circuit 221 to receive the first bias voltage (or the first bias current). An output terminal of the buffer 225 is coupled to the first terminal of the voltage dividing circuit 222. Based on the buffer 225, the output voltages of the first bias circuit 221 may not be influenced by the currents of a load (e.g., the voltage dividing circuit 222).

Figure 8:
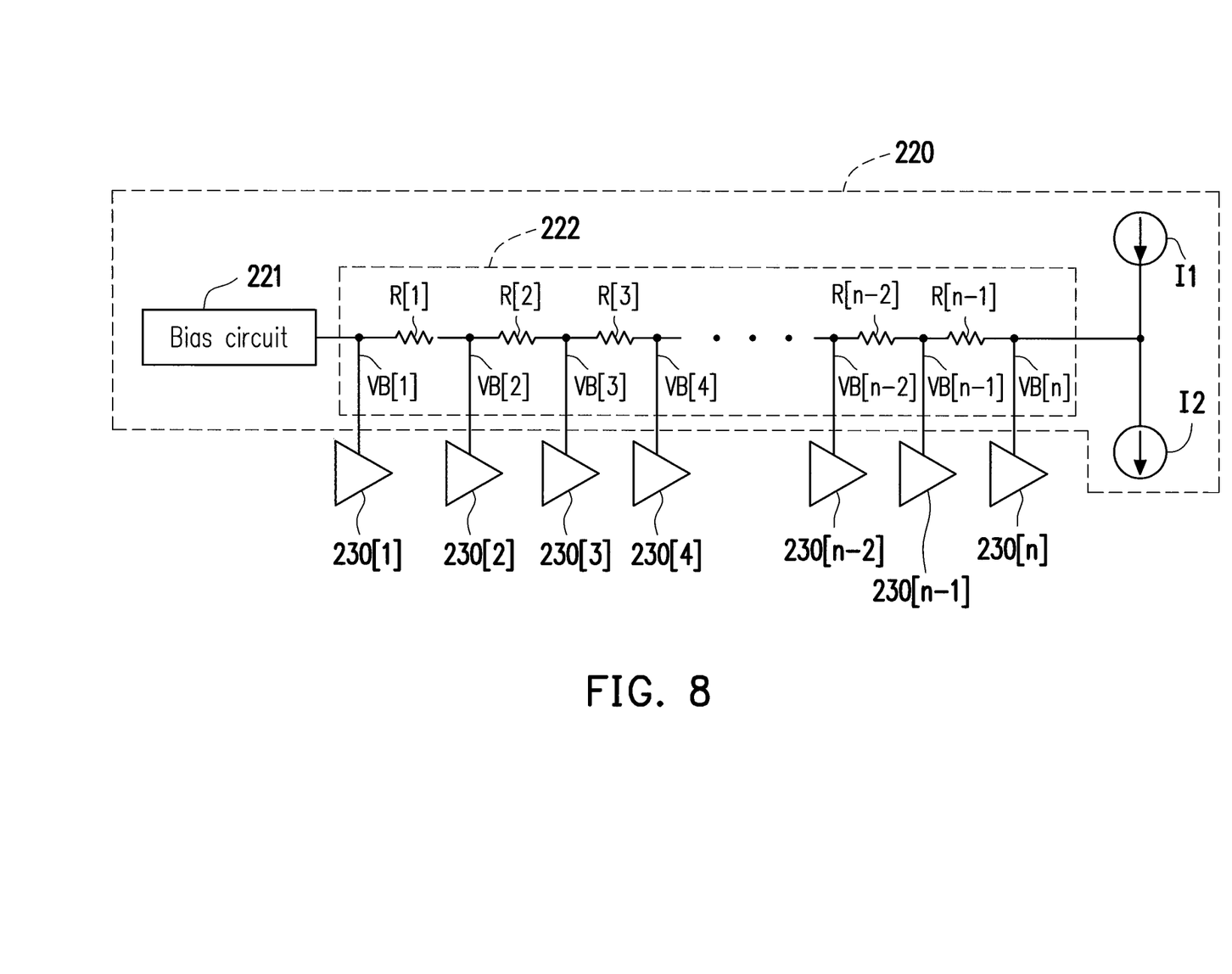
FIG. 8 is a schematic circuit block diagram illustrating the compensation control circuit depicted in FIG. 3 according to still another embodiment of the invention.

FIG. 8 is a schematic circuit block diagram illustrating the compensation control circuit 220 depicted in FIG. 3 according to still another embodiment of the invention. The compensation control circuit 220 illustrated in FIG. 8 includes a bias circuit 221, a voltage dividing circuit 222, a first current source I1 and a second current source I2. The bias circuit 221 may generate a first bias voltage (or a first bias current). A first terminal of the voltage dividing circuit 222 is coupled to the bias circuit 221 to receive the first bias voltage (or the first bias current). A second terminal of the voltage dividing circuit 222 is coupled to a current output terminal of the first current source I1 and a current input terminal of the second current source I2. A plurality of voltage dividing nodes of the voltage dividing circuit 222 provide a plurality of divided voltages to bias terminals of the output buffer circuits 230[1] to 230[n] respectively to determine the tail currents of the output buffer circuits 230[1] to 230[n]. The compensation control circuit 220, the bias circuit 221 and the voltage dividing circuit 222 illustrated in FIG. 8 may be derived with reference to the descriptions related to the embodiments illustrated in FIG. 4, FIG. 5 and/or FIG. 6 and thus, will not be repeated. Based on a setting of the bias voltage (or the bias current) output by the bias circuit 221, a setting of a current output by the first current source I1, and/or a setting of a current drained by the second current source I2, the compensation control circuit 220 may adjust the slew rates of the output terminals of the output buffer circuits 230[1] to 230[n], such that the slew rates of the output buffer circuits 230[1] to 230[n] are adapted to the delay times of the data lines DL[1] to DL[n] of the display panel 120.

Figure 9:
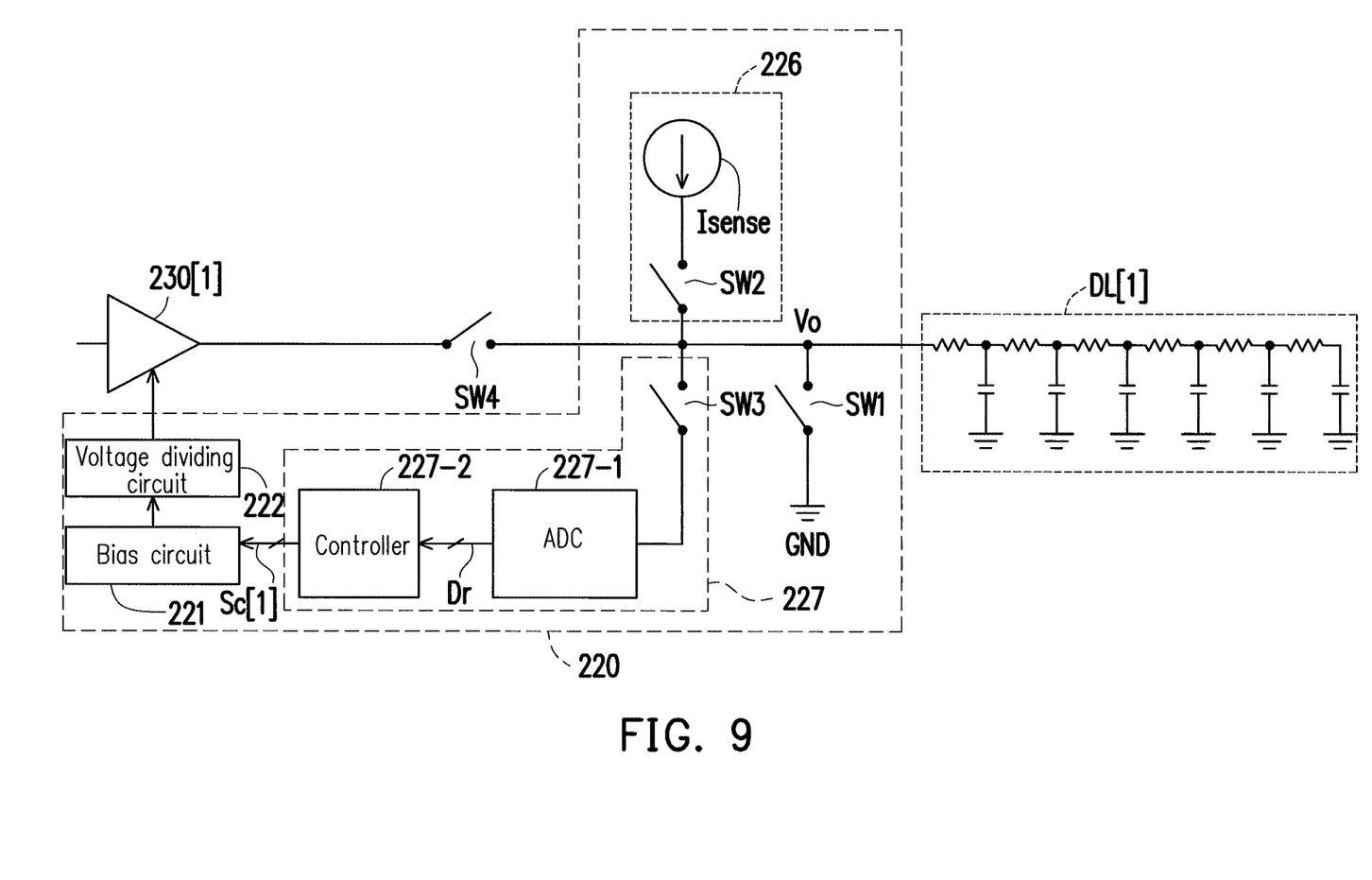
FIG. 9 is a schematic circuit block diagram illustrating the compensation control circuit depicted in FIG. 3 according to further another embodiment of the invention.

FIG. 9 is a schematic circuit block diagram illustrating the compensation control circuit 220 depicted in FIG. 3 according to further another embodiment of the invention. FIG. 9 further illustrates the output buffer circuit 230[1], a switch SW4 and the data line DL[1]. The data line DL[1] illustrated in FIG. 9 includes a plurality of parasitic resistances and a plurality of parasitic capacitances. In the embodiment illustrated in FIG. 9, the compensation control circuit 220 includes a first bias circuit 221, a voltage dividing circuit 222, a charging source circuit 226, a reset switch SW1 and a control circuit 227. The compensation control circuit 220, the first bias circuit 221 and the voltage dividing circuit 222 illustrated in FIG. 9 may be derived with reference to the descriptions related to the embodiments illustrated in FIG. 4, FIG. 5 and/or FIG. 6 and thus, will not be repeated.

The charging source circuit 226 is coupled to an output terminal of a corresponding buffer circuit among the output buffer circuits 230[1] to 230[n]. For instance, the charging source circuit 226 is coupled to the output terminal of the output buffer circuit 230[1] (i.e., the corresponding buffer circuit). A first terminal of the reset switch SW1 is coupled to the output terminal of the output buffer circuit 230[1] (i.e., the corresponding buffer circuit). A second terminal of the reset switch SW1 is coupled to a reset voltage (e.g., a ground voltage GND or any other constant voltage). The control circuit 227 is coupled to the output terminal of the corresponding buffer circuit. In a reset period, the reset switch SW1 is turned on. In a charging period, the charging source circuit 226 charges one of the data lines (e.g., the data line DL[1]) which is connected to the corresponding buffer circuit. In a detection period, the charging source circuit 226 stops charging the data line DL[1], and the control circuit 227 detects the data line DL[1] to obtain a detection result. In a normal operation period, the reset switch SW1 is turned off. According to the detection result, the control circuit 227 controls either or both of the first bias circuit 221 and the second bias circuit 223 in the normal operation period to adjust the bias voltage (or the bias current). In the embodiment illustrated in FIG. 9, the control circuit 227 controls the first bias circuit 221 according to the detection result to adjust the first bias voltage (or the first bias current). In the normal operation period, the charging source circuit 226 and the control circuit 227 do not influence the data line DL[1].

In the embodiment illustrated in FIG. 9, the charging source circuit 226 includes a current source Isense and a charging switch SW2. A first terminal of the charging switch SW2 is coupled to a current output terminal of the current source Isense. A second terminal of the charging switch SW2 is coupled to the output terminal of the corresponding buffer circuit (e.g., the output buffer circuit 230[1]). In the charging period, the charging switch SW2 is turned on. In the normal operation period, the charging switch SW2 is turned off.

In the embodiment illustrated in FIG. 9, the control circuit 227 includes a detection switch SW3, an analog-to-digital converter (ADC) 227_1 and a controller 227_2. A first terminal of the detection switch SW3 is coupled to the output terminal of the corresponding buffer circuit (e.g., the output buffer circuit 230[1]). In the detection period, the detection switch SW3 is turned on. In the normal operation period, the detection switch SW3 is turned off. An input terminal of the ADC 227_1 is coupled to a second terminal of the detection switch SW3. An input terminal of the controller 227_2 is coupled to an output terminal of the ADC 227_1 to a receive detection result Dr. The controller 227_2 converts the detection result Dr into a setting value Sc[1], and the controller 227_2 outputs the setting value Sc[1] to either or both of the first bias circuit 221 and the second bias circuit 223 to adjust either or both of the first bias voltage (or the first bias current) and the second bias voltage (or the second bias current). In the embodiment illustrated in FIG. 9, the controller 227_2 outputs the setting value Sc[1] to the first bias circuit 221 to adjust the first bias voltage (or the first bias current).

Figure 10:
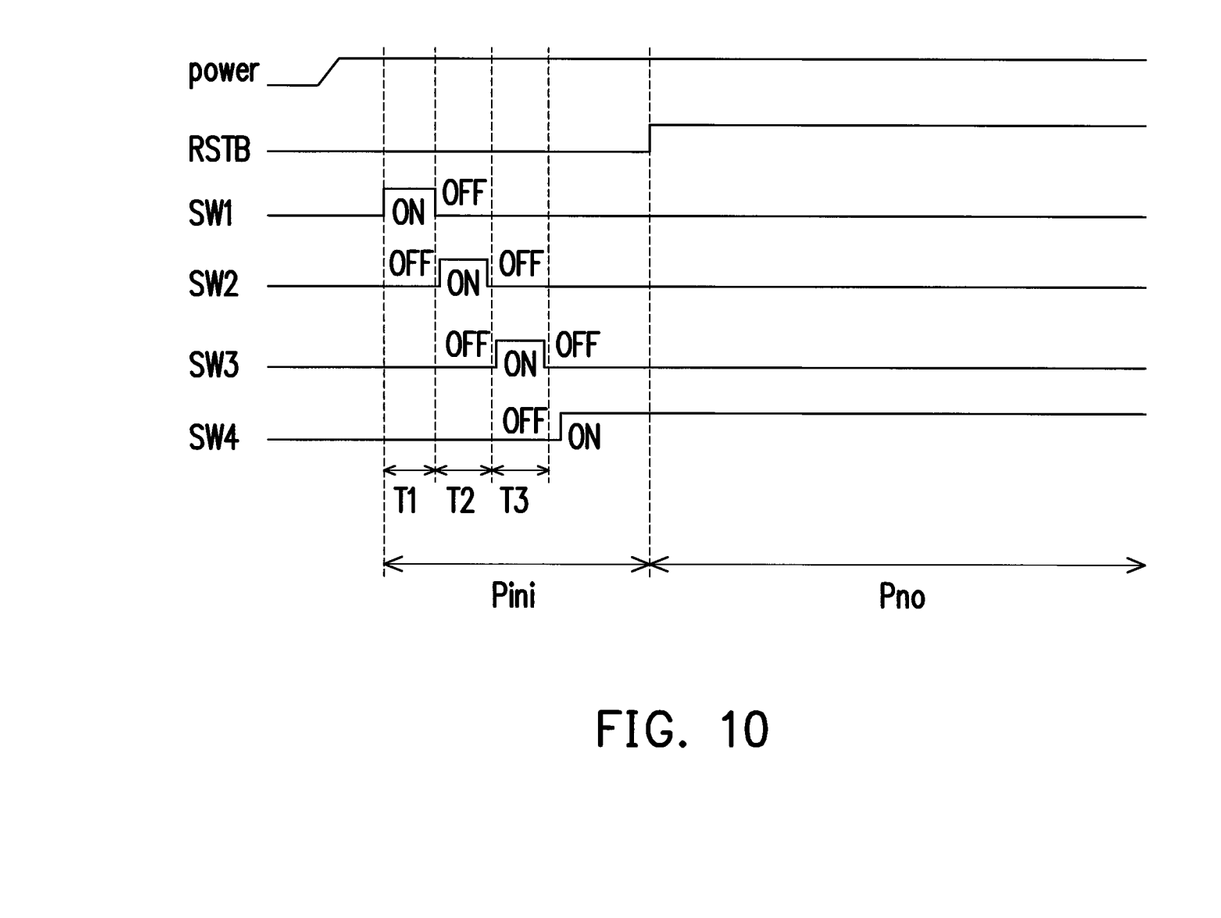
FIG. 10 is a schematic signal timing diagram of the circuits depicted in FIG. 9 according to an embodiment of the invention.

FIG. 10 is a schematic signal timing diagram of the circuits depicted in FIG. 9 according to an embodiment of the invention. In FIG. 10, the horizontal axis represents time, and the vertical axis represents voltages. After a system power (e.g., a power illustrated in FIG. 10) is powered on, the driving IC 200 (or 300) enters an initialization period Pini. A system reset signal RSTB may define the initialization period Pini. When the system reset signal RSTB has a low potential, the driving IC 200 (or 300) enters the initialization period Pini. When the system reset signal RSTB has a high potential, the driving IC 200 (or 300) ends the initialization period Pini and enters a normal operation period Pno.

The reset switch SW1, the charging switch SW2, the detection switch SW3 and the switch SW4 are controlled by the controller 227_2. In a reset period T1, the reset switch SW1 is turned on, and the charging switch SW2, the detection switch SW3 and the switch SW4 are turned off. The voltage of the data line DL[1] is pulled down to the reset voltage (e.g., the ground voltage GND) in the reset period T1.

In a charging period T2, the charging switch SW2 is turned on, and the reset switch SW1, the detection switch SW3 and the switch SW4 are turned off. The output terminal of the output buffer circuit 230[1] is charged in the charging period T2, such that a voltage Vo of the output terminal of the output buffer circuit 230[1] is pulled up. The speed of pulling up the voltage is influenced by an impendence of the data line DL[1], where the impendence of the data line DL[1] depends on a length of the data line DL[1]. In a detection period T3, the detection switch SW3 is turned on, and the reset switch SW1, the charging switch SW2 and the switch SW4 are turned off. The ADC 227_1 converts a voltage level of the output terminal of the output buffer circuit 230[1] into a digital detection result Dr and outputs the detection result Dr to the controller 227_2. Thus, the controller 227_2 may detect the voltage Vo of the output terminal of the output buffer circuit 230[1] in the detection period T3, thereby obtaining an impedance of the data line DL[1].

In the detection period T3, the controller 227_2 may obtain the impedance information (i.e., the detection result Dr) of the data line DL[1]. The controller 227_2 may convert the impedance information (i.e., the detection result Dr) of the data line DL[1] into a setting value Sc[1], and the controller 227_2 outputs the setting value Sc[1] to the first bias circuit 221. After the detection period T3 ends, the reset switch SW1, the charging switch SW2 and the detection switch SW3 are turned off, and thus, the compensation control circuit 220[1](or 220) does not influence operations of the driving channel circuit 210[1] and the data line DL[1]. After the initialization period Pini ends, the driving IC 200 (or 300) enters the normal operation period Pno. In the normal operation period Pno, the reset switch SW1, the charging switch SW2 and the detection switch SW3 are turned off, and the switch SW4 is turned on. The controller 227_2 may control/adjust the first bias voltage (or the first bias current) output by the first bias circuit 221 according to the setting value Sc[1]. In the same or alternative embodiments, the controller 227_2 may control/adjust the second bias voltage (or the second bias current) output by the second bias circuit 223 according to the setting value in the same way.

It should be noted that in different application scenarios, related functions of the controller 227_2 may be implemented in a form of software, firmware or hardware by employing general programming languages (e.g., C or C++), hardware description languages (e.g., Verilog HDL or VHDL) or other suitable programming languages. The programming languages capable of executing the related functions may be deployed in any computer-accessible media, such as magnetic tapes, semiconductor memories, magnetic disks or compact disks (e.g., CD-ROM or DVD-ROM) or may be delivered through the Internet, wired communication, wireless communication or other communication media. The programming languages may be stored in the computer-accessible media for a processor of a computer to access/execute the programming codes of the software (or firmware).

In terms of hardware implementation, by being combined with the aspects disclosed by the embodiments described herein, the functions described herein may be implemented or executed by various exemplary logics, logic blocks, modules and circuits in one or more controllers, microcontrollers, microprocessors, application-specific integrated circuits (ASIC), digital signal processors (DSPs), field programmable gate arrays (FPGAs) and/or other processing units. Moreover, the apparatus and the method of the invention may be implemented by means of a combination of hardware and software.

Figure 11:
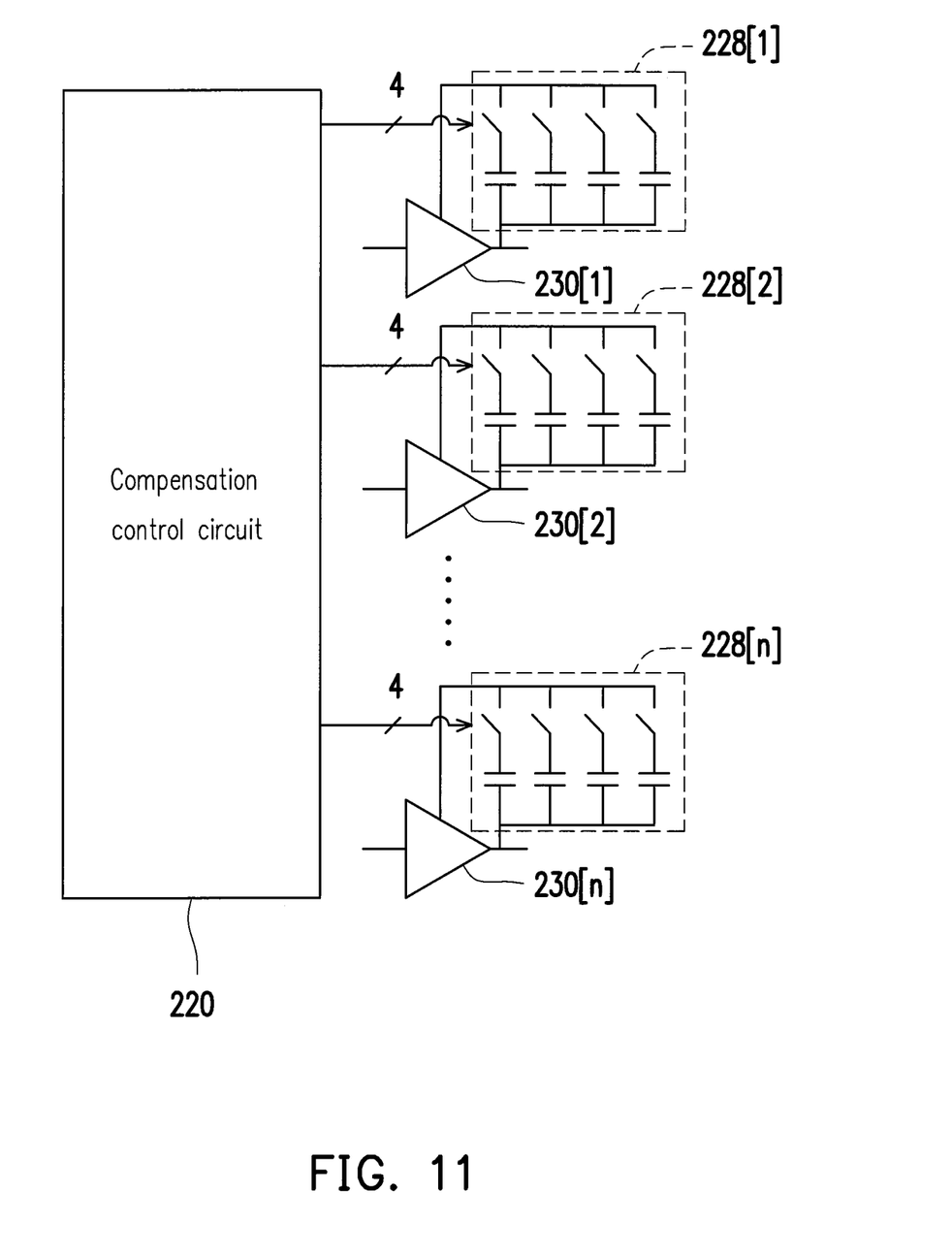
FIG. 11 is a schematic circuit block diagram illustrating the compensation control circuit depicted in FIG. 3 according to another embodiment of the invention.
Figure 12A:
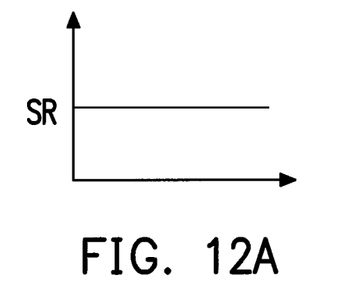
FIG. 12A to FIG. 12I are curves of slew rate of the output buffer circuits in FIG. 3 according to different embodiments of the invention.
Figure 12B:
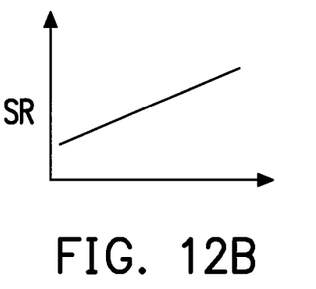
Figure 12C:
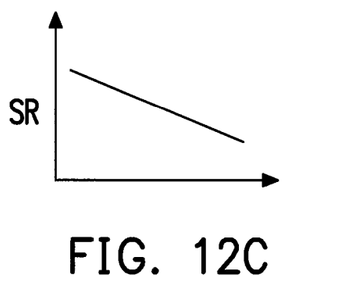
Figure 12D:
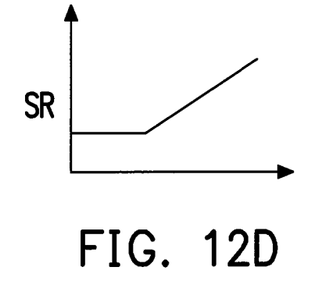
Figure 12E:
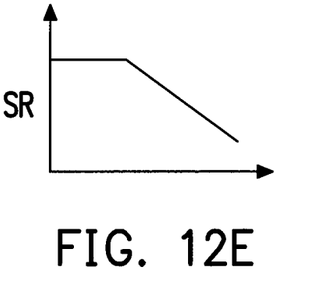
Figure 12F:
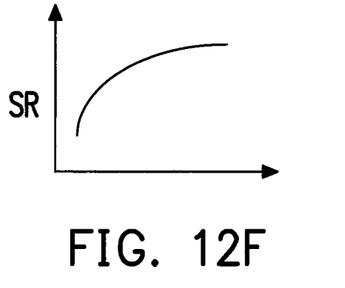
Figure 12G:
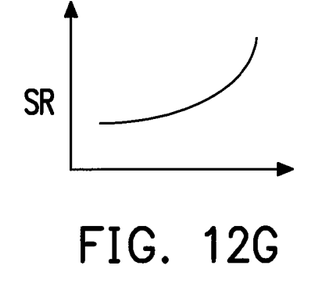
Figure 12H:
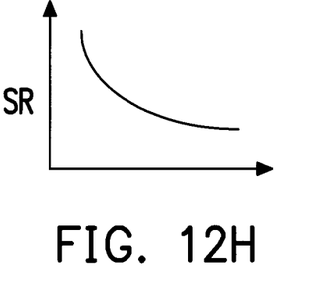
Figure 12I:
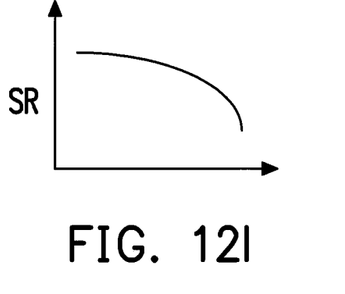

FIG. 11 is a schematic circuit block diagram illustrating the compensation control circuit 220 depicted in FIG. 3 according to another embodiment of the invention. In the embodiment illustrated in FIG. 11, the compensation control circuit 220 includes a variable capacitor 228[1], a variable capacitor 228[2], . . . and a variable capacitor 228[n]. A first terminal of the variable capacitor 228[1] is coupled to the output terminal of the output buffer circuit 230[1] (i.e., the corresponding buffer circuit). A second terminal of the variable capacitor 228[1] is coupled to a gain stage (not shown) of the output buffer circuit 230[1] (i.e., the corresponding buffer circuit). Thus, the Miller capacitance of the output buffer circuit 230[1] (i.e., the corresponding buffer circuit) may be changed according to a capacitance value of the variable capacitor 228[1]. The gain stage and the Miller capacitance may refer to conventional circuits and thus, will not be repeated. The variable capacitors 228[2] to 228[n] may be derived with reference to the description related to the variable capacitor 228[1] and thus, will not be repeated.

FIG. 12A to FIG. 12I are curves of slew rate SR of the output buffer circuits 230[1] to 230[n] in FIG. 3 according to different embodiments of the invention. In each of FIG. 12A to FIG. 12I, the horizontal axis represents location of the output buffer circuits 230[1] to 230[n], and the vertical axis represents slew rate SR. It is noted that the slew rates in all of the embodiments demonstrate monotonic distributions. However, in other embodiments, the slew rate can be non-monotonically distributed or any distributions required by designs. The compensation control circuit 220 may adjust slew rates SR of the output buffer circuits 230[1] to 230[n], such that the slew rates of the output buffer circuits 230[1] to 230[n] are adapted to delay times of the data lines DL[1] to DL[n] of the display panel 120.

In light of the foregoing, the driving IC and the fan-out compensation method thereof provided by the embodiments of the invention may use the compensation control circuit. Based on a design requirement, the compensation control circuit can adjust the tail currents and/or the Miller capacitances of the output buffer circuits, so as to adjust the slew rates of the output terminals of the output buffer circuits. The adjustment of the slew rates can compensate the differences in delay times caused by the differences in the resistances between the data lines of the display panel. Based on the settings of the tail currents and/or the Miller capacitances, the compensation control circuit can adjust the slew rates of the output terminals of the output buffer circuits, such that the slew rates of the output buffer circuits are adapted to the delay times of the data lines of the display panel.

Moreover, in some embodiments a voltage dividing circuit can be disposed, including a plurality of coupling elements, each coupled between two voltage dividing nodes of a plurality of voltage dividing nodes. The voltage dividing nodes can be coupled to the bias terminals of a plurality of output buffer circuits respectively. A plurality of bias circuits can be disposed, such as a first bias circuit for biasing a first voltage dividing node of the voltage dividing nodes to have a first bias voltage, and a second bias circuit for biasing a last voltage dividing node of the voltage dividing nodes to have a second bias voltage.

Furthermore, in the embodiments, by adjusting the slew rates of the Channel OPs or the output buffer circuits, the OPs or the output buffer circuits can tend to discharge/charge the panel with a consistent speed. Preferably, a greater resistance value of a fan-out resistor can accompany a faster slew rate and conversely, while a smaller resistance value of a fan-out resistor can accompany a slower slew rate. In some embodiments, by introducing a current flowing through bias terminals of the output buffer circuits, voltage levels at the bias terminals of the output buffer circuits can have a monotonic or non-monotonic distribution. This causes the outputs of the output buffer circuits to have different slew rates, thus achieving compensation for the differences caused by the fan-out resistors.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A driving integrated circuit (IC), configured to drive a display panel, comprising:
    a plurality of driving channel circuits;
    a plurality of output buffer circuits, wherein a plurality of input terminals of the output buffer circuits are coupled to a plurality of output terminals of the driving channel circuits in one-to-one manner, a plurality of output terminals of the output buffer circuits are configured to be coupled to a plurality of data lines of the display panel in one-to-one manner; and
    a compensation control circuit, coupled to the output buffer circuits for adjusting slew rates of the output terminals of the output buffer circuits to compensate differences in delay times between the data lines of the display panel,
    wherein the compensation control circuit is configured to induce a current to flow through a current path from a first node at a first voltage level to a second node at a second voltage level different from the first voltage level, such that a plurality of bias voltages having different voltage levels are generated from the current and are distributed on the current path, wherein a plurality of bias terminals of the output buffer circuits are configured to receive the bias voltages having different voltage levels from the current path,
    wherein the compensation control circuit comprises:
        a first bias circuit, configured to provide at least one first bias voltage or current;
        a second bias circuit, configured to provide at least one second bias voltage or current; and
        a voltage dividing circuit, having a first terminal and a second terminal respectively served as the first node and the second node, the first terminal of the voltage dividing circuit is coupled to the first bias circuit to receive the first bias voltage or current provided from the first bias circuit, the second terminal of the voltage dividing circuit is coupled to the second bias circuit to receive the second bias voltage or current provided from the second bias circuit, and a plurality of resistors are coupled between a plurality of voltage dividing nodes of the voltage dividing circuit for providing a plurality of divided voltages served as the bias voltages to the plurality of bias terminals of the output buffer circuits respectively,
        wherein the first bias circuit and the second bias circuit provide a voltage differentiating range or a current differentiating range for operating the voltage dividing circuit.

2. The driving IC according to claim 1, wherein the compensation control circuit changes tail currents of the output buffer circuits or the Miller capacitances of the output buffer circuits for adjusting the slew rates of the output buffer circuits.

3. The driving IC according to claim 1, wherein the compensation control circuit further comprises:
    a third bias circuit, configured to generate at least one third bias voltage or current to one of the voltage dividing nodes.

4. The driving IC according to claim 1, wherein the divided voltages depend upon the at least one first bias voltage or current and the at least one second bias voltage or current and resistance values of the resistors.

5. A driving integrated circuit (IC), configured to drive a display panel, comprising:
    a plurality of driving channel circuits;
    a plurality of output buffer circuits, wherein a plurality of input terminals of the output buffer circuits are coupled to a plurality of output terminals of the driving channel circuits in one-to-one manner, and a plurality of output teiminals of the output buffer circuits are configured to be coupled to a plurality of data lines of the display panel in one-to-one manner, wherein each of the output buffer circuits has a bias terminal;

a voltage dividing circuit, comprising a resistive element string, wherein the resistive element string comprises a plurality of resistive elements connected in series with each other, each of the resistive elements is coupled between two voltage dividing nodes of a plurality of voltage dividing nodes, the voltage dividing nodes are coupled to the bias terminals of the output buffer circuits respectively; and a plurality of bias circuits, comprising a first bias circuit and a second bias circuit, wherein the first bias circuit provides a first bias voltage to a first terminal of the resistive element string for biasing a first voltage dividing node of the voltage dividing nodes, and the second bias circuit provides a second bias voltage to a second terminal of the resistive element string for biasing a last voltage dividing node of the voltage dividing nodes, wherein the first bias circuit and the second bias circuit provide a voltage differentiating range or a current differentiating range for operating the voltage dividing circuit.

6. The driving IC according to claim 5, wherein the bias circuits are configured to cause a current to flow from the first voltage dividing node to the last voltage dividing node through the coupling elements and the other voltage dividing nodes.

7. The driving IC according to claim 5, wherein the bias voltages are distributed from the first voltage dividing node to the last voltage dividing node through the coupling elements and the other voltage dividing nodes.

8. The driving IC according to claim 7, wherein the bias voltages are increasingly or decreasingly distributed from the first voltage dividing node to the last voltage dividing node.

9. The driving IC according to claim 5, wherein the coupling elements are resistive elements.

10. The driving IC according to claim 5, wherein the bias circuits further comprise a third bias circuit for biasing a third voltage dividing node of the voltage dividing nodes to have a third bias voltage, wherein the third voltage dividing node is one of the voltage dividing nodes other than the first and last voltage dividing nodes.

11. A fan-out compensation method of a driving IC, configured to drive a display panel, wherein the driving IC comprises a plurality of driving channel circuits, a plurality of output buffer circuits and a compensation control circuit a plurality of input terminals of the output buffer circuits are coupled to a plurality of output terminals of the driving channel circuits in one-to-one manner, and a plurality of output terminals of the output buffer circuits are configured to be coupled to a plurality of data lines of the display panel in one-to-one manner, the fan-out compensation method comprising:

adjusting slew rates of the output terminals of the output buffer circuits by the compensation control circuit, so as to compensate differences in delay times between the data lines of the display panel; and inducing a current to flow through a current path from a first node at a first voltage level to a second node at a second voltage level different from the first voltage level, such that a plurality of bias voltages having different voltage levels are generated from the current and are distributed on the current path, wherein a plurality of bias terminals of the output buffer circuits are configured to receive the bias voltages having different voltage levels from the current path, wherein the step of adjusting the slew rates of the output terminals of the output buffer circuits comprises:

providing at least one first bias voltage or current from a first bias circuit to a first terminal of a resistor string of a voltage dividing circuit, which is served as the first node, wherein the resistor string comprises a plurality of resistors connected in series with each other;

providing at least one second bias voltage or current from a second bias circuit to a second terminal of the resistor string of the voltage dividing circuit, which is served as the second node; and providing, by the plurality of resistors coupled between a plurality of voltage dividing nodes of the voltage dividing circuit, a plurality of divided voltages served as the bias voltages to the plurality of bias terminals of the output buffer circuits respectively, wherein the first bias circuit and the second bias circuit provide a voltage differentiating range or a current differentiating range for operating the voltage dividing circuit.

12. The fan-out compensation method according to claim 11, further comprising:

generating at least one third bias voltage or current to one of the voltage dividing nodes by a third bias circuit.

* * * * *